(12) United States Patent
Zhang et al.

(10) Patent No.: US 9,730,367 B1
(45) Date of Patent: Aug. 8, 2017

(54) SYSTEMS AND METHODS TO IMPROVE SENSOR SENSITIVITY AND RANGE IN AN ELECTRONIC COMPUTING DEVICE

(71) Applicant: Amazon Technologies, Inc., Reno, NV (US)

(72) Inventors: Zhibin Zhang, Cupertino, CA (US); Haleigh Alessandro Vierra, Brentwood, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 806 days.

(21) Appl. No.: 14/135,316

(22) Filed: Dec. 19, 2013

(51) Int. Cl.
*H05K 9/00* (2006.01)

(52) U.S. Cl.
CPC .................... *H05K 9/0064* (2013.01)

(58) Field of Classification Search
CPC ...................................................... H05K 9/0064
See application file for complete search history.

(56) References Cited

U.S. PATENT DOCUMENTS

| | | | | |
|---|---|---|---|---|
| 6,340,920 B1* | 1/2002 | Tseng | ...................... | H03B 5/364 331/116 FE |
| 7,391,201 B2* | 6/2008 | Ji | ............................ | G05F 1/575 323/303 |
| 2011/0221346 A1* | 9/2011 | Lee | ..................... | H05B 33/0812 315/122 |
| 2014/0253032 A1* | 9/2014 | Bruwer | ................... | H02M 1/36 320/108 |
| 2015/0022168 A1* | 1/2015 | Mednik | ................. | H02M 3/155 323/282 |
| 2015/0048752 A1* | 2/2015 | Van Den Brink | ...... | H02J 5/005 315/246 |
| 2015/0138846 A1* | 5/2015 | Yau | ................... | H02M 3/33507 363/21.04 |

* cited by examiner

*Primary Examiner* — Jared Fureman
*Assistant Examiner* — James Evans
(74) *Attorney, Agent, or Firm* — Pierce Atwood LLP

(57) ABSTRACT

Approaches are described for managing effects such as interference, crosstalk, and other types of noise in an electronic environment using a physical and/or electronic switch to improve electrode performance of a measurement system. Such approaches enable a component, such as a sensing electrode or other proximity sensing component of a measurement system of a computing device (e.g., a mobile phone, tablet computer, etc.) or other electronic device to be collocated, or otherwise placed in proximity, with one or more potential noise producing components, such as a ground plane, which can interfere or otherwise degrade the performance (i.e., electrode efficiency and/or electrode sensitivity) of the sensing electrode of the measurement system.

19 Claims, 5 Drawing Sheets

SYSTEMS AND METHODS TO IMPROVE SENSOR SENSITIVITY AND RANGE IN AN ELECTRONIC COMPUTING DEVICE

BACKGROUND

Users demand smaller electronic devices that offer increasing processing capacity and functionality. However, a downside to providing smaller devices with increased functionality is that a greater number of components are packaged into a smaller device volume, and these components may electrically interfere with one another. For example, capacitive proximity sensors rely on electrostatic fields. When an object passes or is otherwise near a sensing component of the capacitive proximity sensor, the electric field is disturbed and provides an output signal. In some situations, however, due to the size of the computing device, the sensing component of the proximity sensor may need to be positioned near the ground plane of the device. Co-locating the sensing component of the proximity sensor near or around the ground plane of the device can pose several problems. For example, in some situations, the ground plane can impact the sensitivity of the sensing component since the ground plane of the device may absorb the electrostatic field. This can diminish the range of proximity detection and/or prevent proximity detection altogether. Accordingly, device manufacturers are increasingly being challenged with the task of designing proximity measurement systems and other such systems that can at least reduce the influence of the ground plane and provide desired operating characteristics within a relatively limited amount of space.

BRIEF DESCRIPTION OF THE DRAWINGS

Various embodiments in accordance with the present disclosure will be described with reference to the drawings, in which.

DETAILED DESCRIPTION

Figure 1:
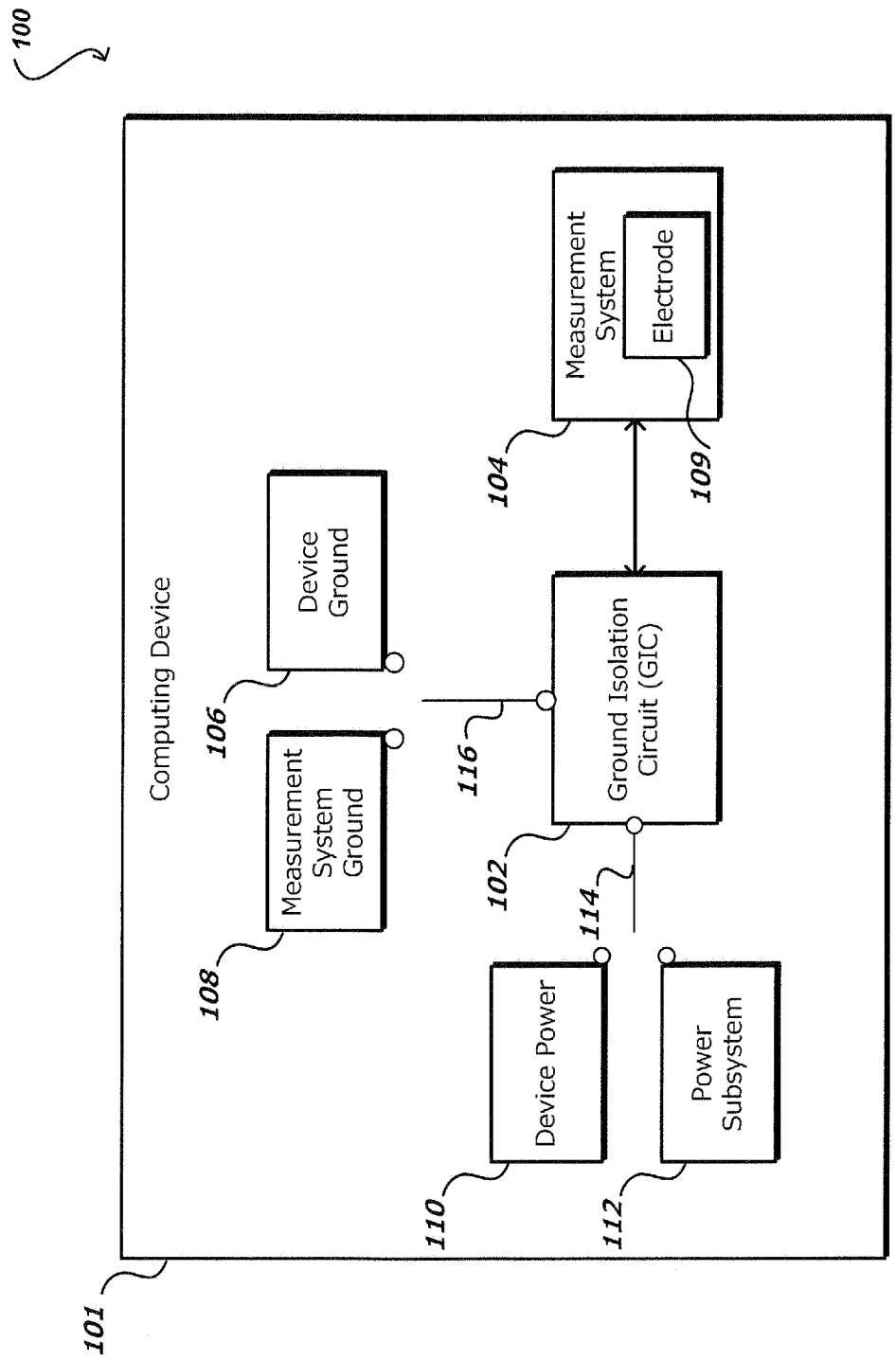
FIG. 1 illustrates an example implementation for managing effects such as interferences, crosstalk and other types of noise in an electronic environment in accordance with various embodiments.

In the following description, various embodiments will be illustrated by way of example and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Systems and methods in accordance with various embodiments of the present disclosure may overcome one or more of the aforementioned and other deficiencies experienced in conventional approaches for managing effects such as interference, crosstalk, and other types of noise in an electronic environment. In particular, various embodiments enable a component, such as a sensing electrode or other proximity sensing component of a measurement system of a computing device (e.g., a mobile phone, tablet computer, etc.) or other electronic device to be collocated, or otherwise placed in proximity with one or more potential noise producing components, such as a device ground component or plane, which can interfere or otherwise degrade the performance (i.e., electrode efficiency and/or electrode sensitivity) of the sensing electrode of the measurement system.

In accordance with various embodiments, in certain devices, it can be preferable that no device grounded metal is near or around the sensing electrode of the measurement system in order for the electrode to operate properly. For example, electrode sensitivity for proximity detection or other such detection can be impacted when the electrode is positioned above or near a ground plane of the device due to electric flux leakage and other types of noise. Accordingly, in accordance with various embodiments, physical and/or electronic switch(es), or other such component(s), can be used to manage effects such as interferences, crosstalk, and other types of noise to improve electrode sensitivity, at least for situations involving a grounded metal near the sensing electrode. For example, in the situation where the electrode is active, the switch(es) can be caused to operate in a first position to electrically isolate the measurement system from the device ground, where at least a portion of the radiated and/or received electrode signals will not couple to the device ground. In other embodiments, the switch can be caused to operate in a second position, where the measurement system can be grounded to the device ground and power from the device (e.g., battery or other power) can be used to charge, calibrate, and/or otherwise provide power to the measurement system. Thereafter, the measurement system can use the stored power to obtain measurements, such as proximity measurements, and/or perform various other functions as will be described herein. In at least these situations, controlling the electrical behavior of the measurement system can be used to provide optimal electrode performance such that accurate measurements can be obtained. Various other functions and advantages are described and suggested below as may be provided in accordance with the various embodiments.

As mentioned above, portable computing devices (such as mobile phones) can include electrodes, antennas, and various components packaged in a relatively limited amount space. This can result in placing electrically sensitive components next to one or more potential noise producing components. As described, co-locating or otherwise placing in close proximity a sensing component (e.g., a proximity sensing electrode) or other electrode of a measurement system such as a capacitive proximity measurement system to a device's ground plane can potentially impact electrode performance. For example, in certain devices, it can be preferable that no grounded metal is near or around the electrode for optimal electrode efficiency. In accordance with various embodiments, electrode efficiency is a measure of the efficiency with which an electrode or other sensing component, such as the one found in portable computing devices, converts a received input into an output signal. However, due to electric flux leakage caused when an electrode is positioned near a ground plane of the device, the sensitivity of the electrode may be reduced, making accurate proximity detection unachievable. Conventional approaches may attempt to place the electrode in a location that is least likely to impact electrode performance. However, moving the electrode away from the ground plane ignores industrial design considerations and/or user experience considerations, where the placement of components in an electronic device can impact aesthetics and/or usability of the device. Accordingly, in accordance with various embodiments, systems and methods provide for controlling the behavior of at least one device component to reduce an amount of noise that can potentially impact electrode performance.

FIG. 1 illustrates an example implementation 100 for managing effects such as interferences, crosstalk and other types of noise in an electronic environment, in accordance with an embodiment. As shown in FIG. 1, a portable computing device 101 (e.g., a mobile phone) includes, for example, a ground isolation circuit (GIC) 102, a measurement system 104, device ground 106, measurement system ground 108, device power 110, and a measurement power component 112. Although a portable computing device (e.g., a mobile phone) is shown, it should be understood that any electronic device capable of receiving, determining, and/or processing input can be used in accordance with various embodiments discussed herein, where the devices can include, for example, desktop computers, notebook computers, personal data assistants, video gaming consoles, television set top boxes, smart televisions, wearable computers (e.g., smart watches, smart glasses, etc.) and portable players, among others.

The measurement system can include at least one electrode 109 located proximate to the ground of the device. As described, electrode sensitivity for proximity detection or other such detection can be impacted when the electrode is positioned above or near a ground plane of the device due to electric flux leakage and other types of noise. Accordingly, in accordance with various embodiments, physical and/or electronic switch(es), or other such component(s), can be used to manage effects such as interferences, crosstalk, and other types of noise to improve electrode sensitivity, at least for situations involving a grounded metal near the sensing electrode. Example switches can include switches 114 and 116. In accordance with various embodiments, the switches can be any electronic component, or combination of components, that can switch an electrical circuit, interrupting the current or diverting it from one component to another. In various embodiments, the electronic switches can be solid state devices such as transistors, although mechanical switches and/or vacuum tubes can be used as well. In various embodiments, a transistor is a semiconductor device used to amplify and switch electronic signals and electrical power. It can be composed of semiconductor material with at least three terminals for connection to an external circuit. In any switching circuit, values of input voltage would be chosen such that the output is either completely "off", or completely "on". The transistor is acting as a switch, and this type of operation is common in digital circuits where only "on" and "off" values are relevant, such as in the case of switching between components and/or isolating components. In accordance with an embodiment, various components can be used as a switch, including, but not limited to, pin diodes (or other diodes), transistors (e.g., bipolar junction transistors (BJTs), field-effect transistors (FETs), complementary metal-oxide-semiconductors (CMOSs), or any other electronic and/or mechanical switch.

In accordance with various embodiments, the measurement system, for example, can be a proximity detection system or other detection system, which can allow for interacting with the computing device without having to make physical contact with the device. A number of approaches can be implemented to allow for this, such as IR, magnetic, optical, ultrasonic, capacitive, among others. In accordance with various embodiments, capacitive sensing generates an electric field as part of the sensing process. Proximity detection is achieved by adjusting the sensitivity of the capacitive sensing circuitry, such as one or more proximity sensors or electrodes (e.g., electrode 109), and/or circuitry controlling the proximity sensors.

The ground isolation circuit 102 can be used to electrically isolate the measurement system 104 from device power 110 and device ground 106 and can electrically connect the measurement system to a measurement system ground 108 and a power subsystem 112 of the measurement system. Switches 114 and 116 can be controlled by the ground isolation circuit, and can be used to control whether the measurement system is connected to device power and device ground or to the power subsystem and the measurement system ground. In this way, the ground isolation circuit can be used to manage effects such as interferences, crosstalk and other types of noise in the computing device. For example, switch 114 and switch 116 can be caused to operate in a first position, where the measurement system can be electrically isolated from the device ground and device power. In this situation, the measurement system can be electrically connected to the power subsystem and the measurement system ground instead of device power and device ground. In accordance with various embodiments, this advantageously allows one or more electrodes of the measurement system to achieve maximum efficiency since at least a portion of the radiated and/or received sensing component will not couple to the ground of the device. When switches 114 and 116 are caused to operate in a second position, the measurement system can be grounded to the device ground and can power from the device (e.g., battery or other power) can be used for at least one of charging and/or calibrating the measurement system. Thereafter, the measurement system can use the power subsystem to obtain measurements and perform various other functions as will be described herein.

Figure 2:
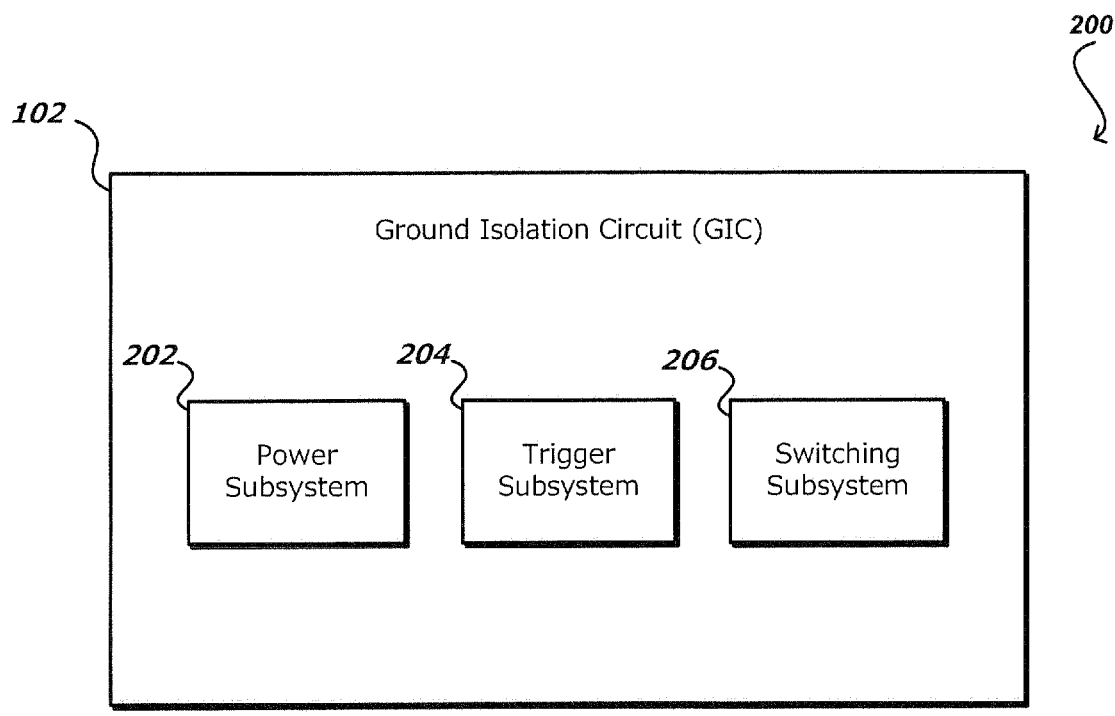
FIG. 2 illustrates example components of a ground isolating circuit in accordance with various embodiments.

FIG. 2 illustrates example set of components 200 of a ground isolating circuit in accordance with various embodiments. As shown in FIG. 2, the ground isolating circuit can include, for example, a power subsystem 202, a trigger subsystem 204, and a switching subsystem 206. At device power up, the power subsystem can execute a calibration or other startup process wherein one or more capacitors or other energy storing components of the power subsystem can be charged using device power. Thereafter, the stored or separate power of the power subsystem can be used to provide power to a measurement system so that the measurement system can obtain measurement information, such as proximity information, that can include detecting an object with a predetermined distance from the computing device.

In accordance with various embodiments, the measurement system can utilize a controller, such as a microcontroller or other such component, to generate a signal that indicates that the measurement system is about to perform a measurement using one or more electrodes. For example, the controller can generate an activation signal or other signal by setting a pin high (or in some embodiments, low). The controller as well as the signal can be active for a predetermined period of time (e.g., around 25 ms), during which time the measurement information can be obtained by the electrodes.

In accordance with various embodiments, the trigger subsystem can receive the activation signal from the measurement system and the activation signal can be used by the trigger subsystem to trigger the switching component to cause one or more switches to electrically close or open. As described, the switching subsystem can include one or more switches that can be used to control whether the measurement system is connected to device power and device ground or to the power subsystem and the measurement system ground. For example, in response to receiving the signal and the switching subsystem, at least one of the switches can be caused to operate in a first position, where the measurement system can be electrically isolated from the device ground and device power. In response to not receiving the signal, at least one other switch can be caused to operate in a second position, where the measurement system can be grounded to the device ground and power from the device (e.g., battery or other power) can be used to charge the power subsystem. In some embodiments, there can be a predetermined delay after the signal is not received before the other switch is caused to operate in a different position. The time of the predetermined delay can be based on a number of factors, such as an amount of available power, a delay circuit, among others. In some embodiments, rather than multiple switches operating in different positions, only one switch is caused to operate in different positions. Thereafter, the measurement system can use the stored power in the power subsystem to obtain measurements and perform various other functions.

Figure 3:
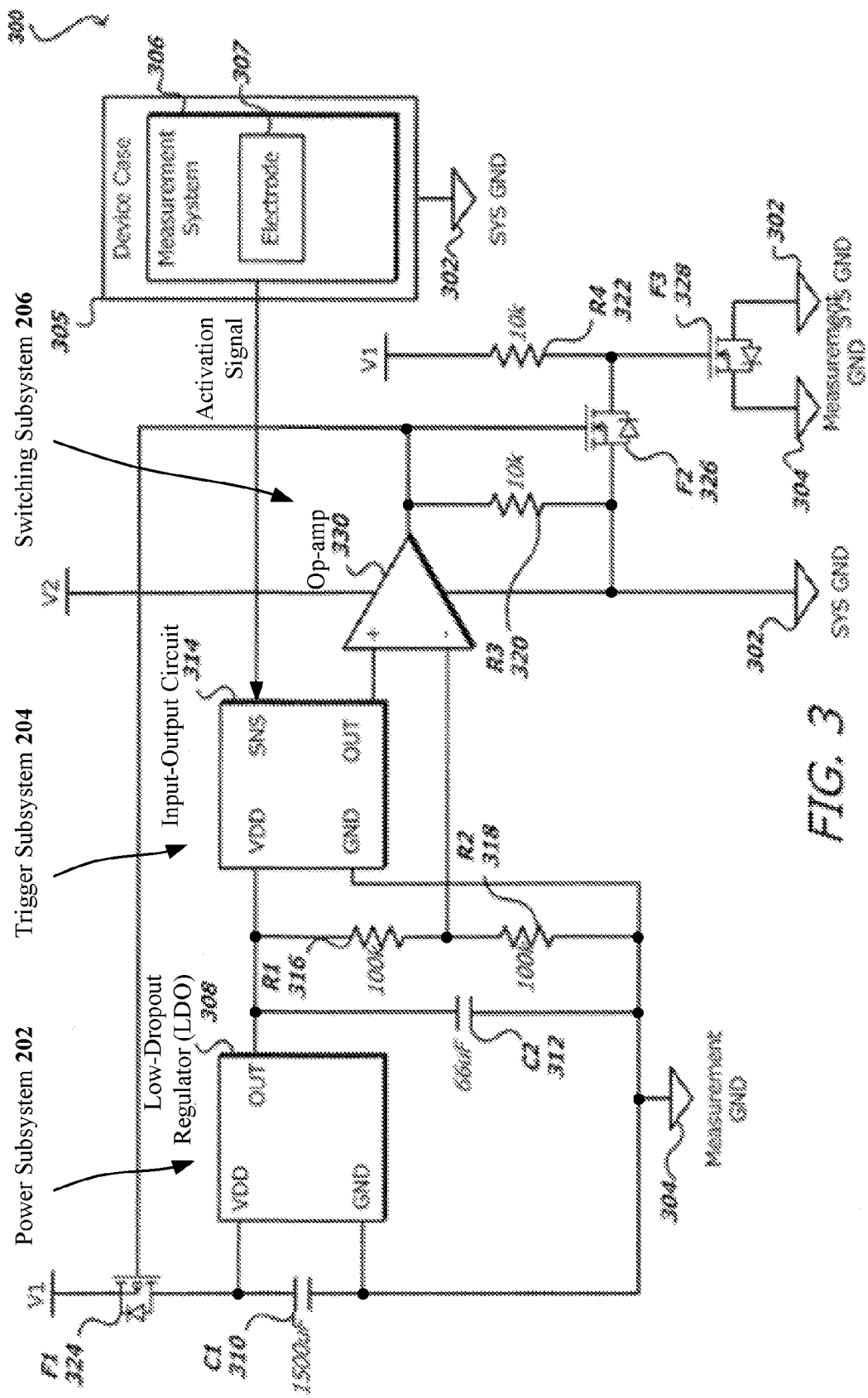
FIG. 3 illustrates an example implementation of a ground isolating circuit for managing effects such as interferences, crosstalk and other types of noise in an electronic environment in accordance with an embodiment.

FIG. 3 illustrates an example implementation 300 of a ground isolating circuit for managing effects such as interferences, crosstalk and other types of noise in an electronic environment in accordance with an embodiment. As described, electrode sensitivity of a measurement system, such as a proximity measure system, decreases when the electrode is positioned above or near a ground plane due to electric flux leakage. In accordance with various embodiments, a ground isolating circuit can be implemented between the measurement system's ground and the device's ground to isolate the measurement system from the device's ground, such as when measurements are being obtained. As shown in FIG. 3, an electrode 307 of the measurement system 306 of a computing device 305 is positioned near the ground of the computing device, where the electrode 307 can obtain measurements, such as proximity measurements of an object determined to be positioned within a predetermined distance of the device. The ground of the computing device is labeled as "SYS GND". As described, the measurement system can be grounded to the device or system ground "SYS GND" 302 when measurements are not being obtained and to the measurement GND 304 when the measurement system is isolated from the device ground.

In accordance with various embodiments, the ground isolating circuit can include at least three subsystems where each subsystem can include one or more components. The subsystems can include, for example, a power subsystem, a trigger subsystem, and a switching subsystem. The subsystems operate together to isolate the measurement system 306 from the device ground for at least the time when a measurement is being obtained. In accordance with various embodiments, the measurement system can be isolated from device ground for a period of time before and/or after a measurement has been obtained.

In accordance with an embodiment, the power subsystem of the ground isolating circuitry can include, for example, a low-dropout regulator (LDO) 308, and a first (e.g., C1) capacitor 310 and second (e.g., C2) capacitor 312. The LDO can include an input pin (i.e., the VDD pin) that receives power, a ground pin (i.e., the GND pin) that is connected to a ground plane such as the measurement system ground, and an output pin (i.e., the OUT pin) that provides an output. In accordance with various embodiments, a LDO can be used to provide a stable power supply voltage independent of load impedance, input-voltage variations, temperature, and time. The LDO can maintain regulation with small differences between supply voltage and load voltage. For example, as a lithium-ion battery drops from 4.2 V (fully charged) to 2.7 V (almost discharged), an LDO can maintain a constant 2.5 V at the load.

The triggering subsystem of the circuitry can include, for example, an input-output circuit 314. The input-output circuit can include an input pin (i.e., the VDD pin) that receives power, a ground pin (i.e., the GND pin) that is connected to a ground plane, a sensing pin (i.e., the SNS pin) that receives an input signal, and an output pin (i.e., the OUT pin) that can output a signal.

The switching subsystem of the circuitry can include, for example, a plurality of resistors (R1 316, R2 318, R3 320, and R4 322), a plurality of transistors (e.g. F1 324, F2 326, and F3 328), and an op-amp 330. The transistors can be metal-oxide-semiconductor field-effect transistors (MOSFET) or any other switching component. In this example, they can be p-channel MOSFETs or n-channel MOSFETs. Transistors F2 and F3 can be, at least in this example, NFET transistors and transistor F1 can be a PFET transistor. It should be noted that other transistors, switching components, or combinations of components providing similar functionality can be used. It should be further noted that the subsystems can be arranged in many ways, and the arrangement shown is an example arrangement. Further, the components included in each subsystem are examples of components that can be used and are not to be taken as limiting. Accordingly, more or fewer components are considered in accordance with the embodiments described herein.

In accordance with various embodiments, PFETs and NFETs can act as a switch, in that they can operate in an on or off state. When the switch is operating in an on state, the switch is electrically closed. As such, current can flow through the switch. When the switch is operating is an off state, the switch is electrically open. As such, current cannot flow through the switch. PFETs are normally closed switches. When a biasing voltage is applied, the PFET switch opens. NFETs are normally open switches. When a biasing voltage is applied, the NFET switch closes. In accordance with various embodiments, logic gate circuits, such as the circuits and components described herein, are designed to input and output two types of signals: "high" (1) and "low" (0), as represented by a variable voltage: full power supply voltage for a "high" state and zero voltage for a "low" state. It should be noted, however, that although logic signal voltage levels rarely attain these limits due to stray voltage drops in the transistor circuitry, gate circuits are designed and configured to attempt interpret signal voltages lying somewhere between full supply voltage and zero. For example, some components can operate on a nominal power supply voltage of 5 volts, +/−0.25 volts. Ideally, a "high" signal would be 5.00 volts exactly, and a "low" signal 0.00 volts exactly. However, components cannot output such perfect voltage levels, and are designed to accept "high" and "low" signals deviating substantially from these ideal values. In accordance with various embodiments, "acceptable" input signal voltages can range, for example, from 0 volts to 0.8 volts for a "low" logic state, and 2 volts to 5 volts for a "high" logic state. "Acceptable" output signal voltages can range from 0 volts to 0.5 volts for a "low" logic state, and 2.7 volts to 5 volts for a "high" logic state.

In accordance with various embodiments, the ground isolating circuit can be configured to operate in at least two stages. The stages can include a calibration stage and an operating stage. During the calibration stage, the power subsystem is charged and threshold values are set, such as the threshold value at the inverting terminal of the op-amp. In the operating stage, the power subsystem, trigger subsystem, and switching subsystem operate to isolate the measurement system from the device ground.

In accordance with an embodiment, during calibration and/or startup (i.e, before a measurement is obtained) device system power, V1, can charge capacitors C1 and C2. In accordance with an embodiment, V1 can be 5V or some other appropriate voltage. V2 can be any appropriate voltage to power the op-amp. In this example, capacitor C1, when charged and disconnected from V1, can provide power to the power subsystem and the power subsystem can provide power to the measurement system. The power from the power subsystem can be used by the measurement system to measure changes to a sensor (e.g., an electrode). C2 provides input power to the trigger subsystem and also biases resistors R1 and R2. In accordance with various embodiments, the biasing voltage is an input to the inverting side of the op-amp. The biasing voltage acts as a threshold, where an input at the non-inverting side of the op-amp that at least meets the threshold can cause the output of the op-amp to go high. The biasing voltage can be changed based at least in part on the values of resistors R1, R2, and the power provided by C2.

Before a measurement is obtained, the measurement system outputs a low to the trigger subsystem. In this situation, the signal (i.e., the activation signal) received at sensing input (e.g., SNS pin) of the trigger input is at or near zero volts. Based at least in part on this input, the output of the trigger subsystem (e.g., OUT pin) is low. The output of the trigger system is received at the non-inverting side of the op-amp. When the signal at the non-inverting side of the op-amp does not at least meet the threshold voltage at the inverting side of the op-amp, the output of the op-amp is low. In this situation, PFET F2 remains an open switch. PFET F3 is pulled high and "turned on" and acts like a closed switch. When PFET F3 acts like a closed switch the measurement system is grounded. Further, NFET F1 remains a closed switch. When NFET F1 acts like a closed switch, current from V1 is used to charge C1. V1 provides an input voltage to the VDD input pin of the LDO and the output voltage of the LDO is used to charge C2. As such, before a measurement is obtained by the measurement system, C1 and C2 are charged.

When the measurement system is about to take a measure it outputs a high signal. The high signal is received at the SNS input of the trigger subsystem. The trigger subsystem outputs a high signal to the non-inverting terminal of the op-amp. When the high signal at the non-inverting terminal at least meets the threshold voltage at the inverting terminal of the op-amp, the op-amp outputs a high signal. The high signal causes the PFET F1 to open, NFET F2 to close, and PFET F3 to open. In this way, the measurement circuit is isolated from device ground and device power V1. The measurement system receives power from the LDO and the LDO receives power stored in C1. The trigger subsystem receives stored power in C2 and C2 further provides a biasing voltage to generate a threshold voltage at the inverting terminal of the op-amp. As described above, because the measurement system is isolated from the device ground, at least a portion of the radiated and/or received electrode signals will not couple to the device ground, which provides isolation to the device ground for optimal electrode efficiency.

Figure 4:
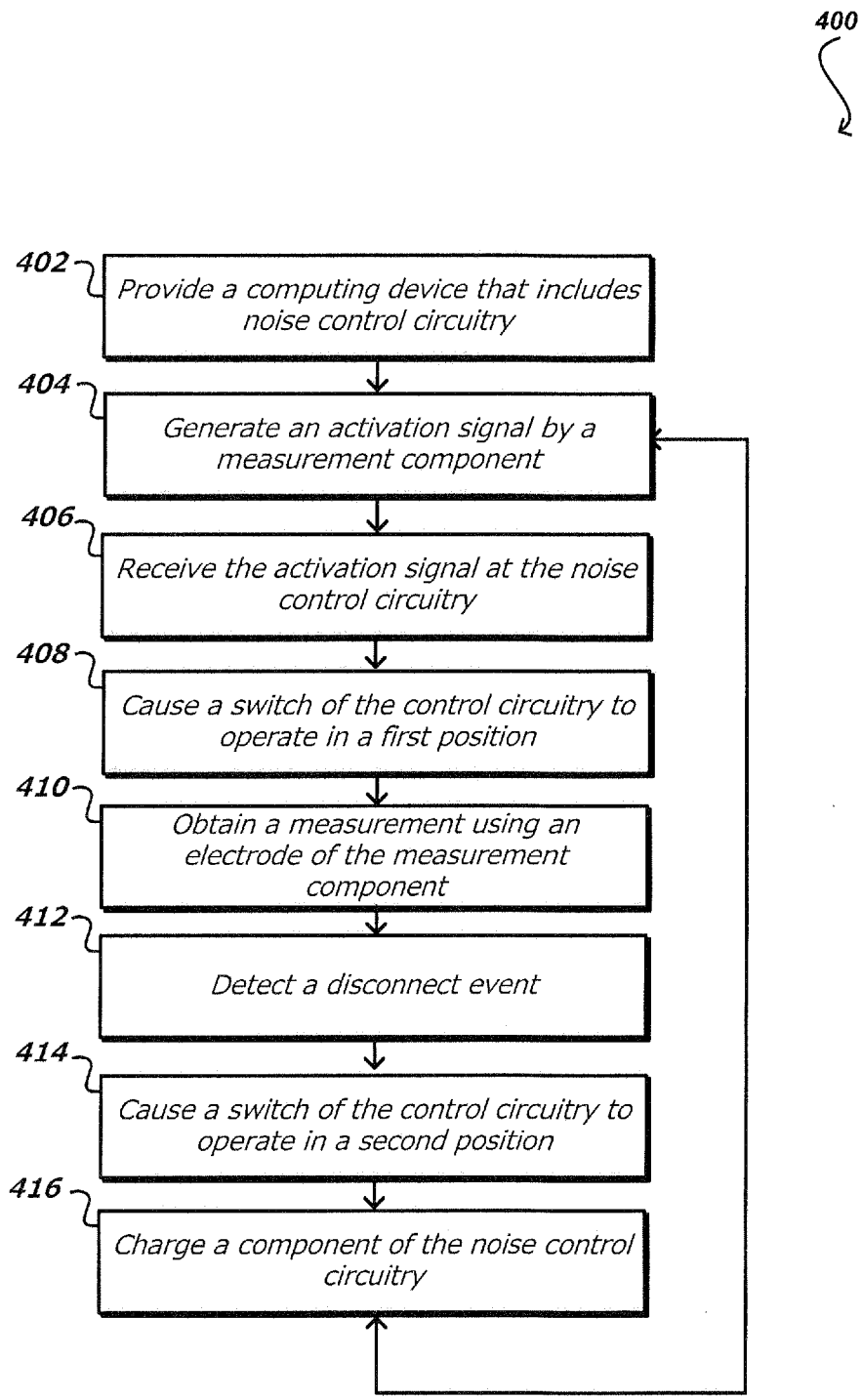
FIG. 4 illustrates an example process for managing effects such as interferences, crosstalk and other types of noise in an electronic environment in accordance with various embodiments.

FIG. 4 illustrates an example process for managing effects such as interferences, crosstalk and other types of noise in an electronic environment in accordance with various embodiments. It should be understood that, for any process described herein, that there can be additional or fewer steps performed in similar or alternative orders, or in parallel, within the scope of the various embodiments unless otherwise stated. As mentioned above, portable computing devices (such as mobile phones) can include electrodes, such as capacitive proximity sensing electrodes packaged in a relatively limited amount of space. This can result in placing electrically sensitive components next to one or more potential noise producing components. As described, co-locating or otherwise placing in close proximity a sensing component (e.g., a proximity sensing electrode) of a capacitive proximity measurement system to a device's ground plane can potentially impact electrode performance of the sensing component. In accordance with various embodiments, a computing device including noise reduction (or control) circuitry can be provided 402. The noise control circuitry can include at least a switching component that can include one or more switches, a power component configured to provide power to the measurement system, and a trigger component configured to provide a signal to activate or deactivate the switching component. In various embodiments, the control circuitry can be connected between a measurement component of the computing device and a first ground component. The measurement component, for example, can be a proximity detection system, which can allow for interacting with the computing device without having to make physical contact with the device. The first ground component can correspond to ground with respect to ground of the computing device and a second ground component can correspond to ground with respect to the measurement component. The measurement component can include at least one sensor or electrode configured to obtain a measurement of an object within a predetermined distance of the computing device.

In accordance with various embodiments, at device power up, a power subsystem of the noise control circuitry can execute a calibration or other startup process wherein one or more capacitors or other energy storing components of the power subsystem can be charged using device power. For example, both the high side switch (i.e., component F1 324 of FIG. 3) and low side switch (i.e., F3 328 of FIG. 3) can be turned on to connect the system ground and measurement ground. The measurement system will charge or otherwise receive power from the device. Thereafter, the stored or separate power of the power subsystem can be used to provide power to a measurement system so that the measurement system can obtain measurement information, such as proximity information, that can include detecting an object with a predetermined distance from the computing device.

For example, an activation signal is generated 404 by the measurement component and is received 406 at the trigger component of the control circuitry. The control circuitry is configured to, in response to receiving an activation signal that at least meets a threshold, cause at least one switch to operate 408 in a first position. In this situation, causing the switch to operate in the first position can ground the measurement component to the second ground component. This can advantageously isolate the measurement component from the first ground component to prevent at least a portion of interference from the first ground component from coupling to the sensor. As such, in this situation, the measurement component can be electrically isolated from the device ground and at least a portion of the radiated and/or received electrode signals will not couple to the device ground. Thereafter, the measurement component can obtain 410 at least one measurement, such as a proximity measurement using an electrode or other sensing component of the measurement component. In certain embodiments, the measurement can be obtained once every predetermined period of time, such as in a periodic manner as one would expect using a pulse train or other interval. Between the pulse train when there is no measurements, the measurement system power subsystem can be charged. As described, this can include charging one or more capacitors of the power subsystem. For example, the control circuitry is further configured to, in response to detecting 412 a disconnect event or the activation signal not meeting the threshold, cause 414 at least one switch to operate in a second position. In this situation, causing the switch to operate in the second position can ground the measurement component to the first ground component. In this situation, power from the device (e.g., battery or other power) can be used to charge 416, calibrate, and/or otherwise provide power to the measurement system. The measurement component can use the stored power to obtain measurements, such as proximity measurements, and/or perform various other functions. Thereafter, the stored or separate power of the power subsystem can be used to provide power to a measurement system so that the measurement system can obtain measurement information, such as proximity information of a use relative to the computing device.

Figure 5:
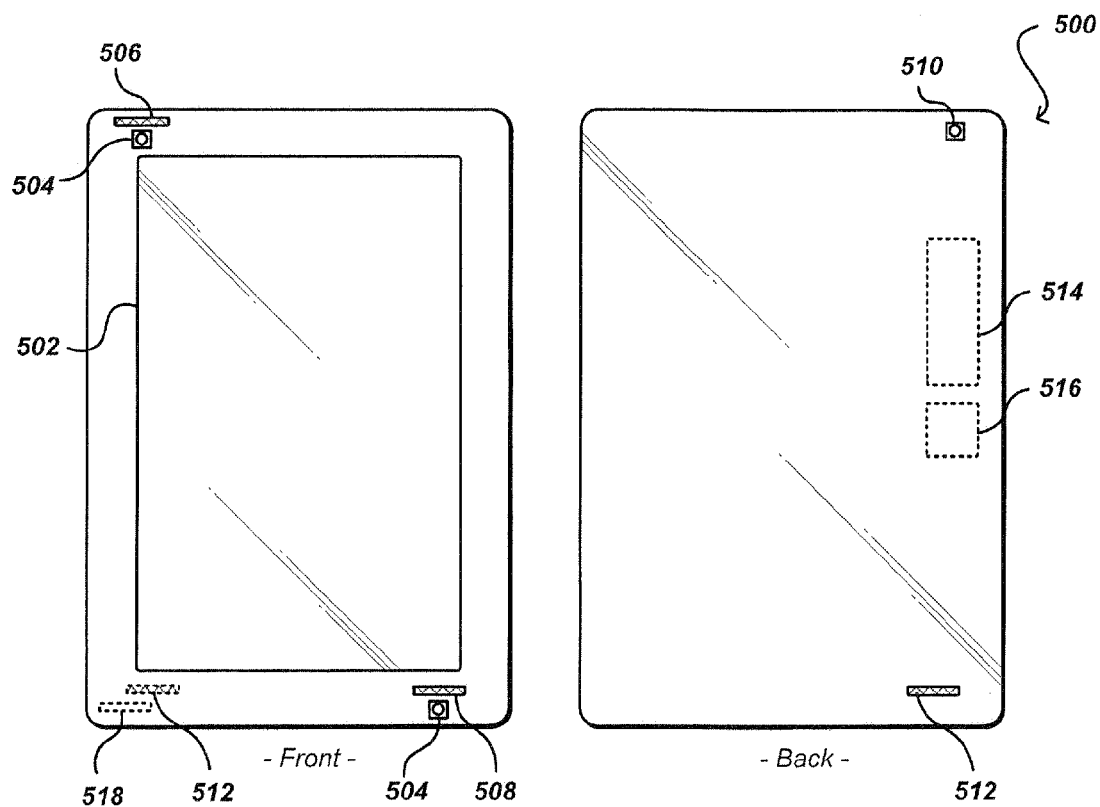
FIG. 5 illustrates front and back views of an example portable computing device that can be used in accordance with various embodiments.

FIG. 5 illustrates front and back views of an example electronic computing device 500 that can be used in accordance with various embodiments. Although a portable computing device (e.g., a smartphone, an electronic book reader, or tablet computer) is shown, it should be understood that any device capable of receiving and processing input can be used in accordance with various embodiments discussed herein. The devices can include, for example, desktop computers, notebook computers, electronic book readers, personal data assistants, cellular phones, video gaming consoles or controllers, television set top boxes, and portable media players, among others.

In this example, the computing device 500 has a display screen 502 (e.g., an LCD element) operable to display information or image content to one or more users or viewers of the device. The display screen of some embodiments displays information to the viewers facing the display screen (e.g., on the same side of the computing device as the display screen). The computing device in this example can include one or more imaging elements, in this example including two image capture elements 504 on the front of the device and at least one image capture element 510 on the back of the device. It should be understood, however, that image capture elements could also, or alternatively, be placed on the sides or corners of the device, and that there can be any appropriate number of capture elements of similar or different types. Each image capture element 504 and 510 may be, for example, a camera, a charge-coupled device (CCD), a motion detection sensor or an infrared sensor, or other image capturing technology.

As discussed, the device can use the images (e.g., still or video) captured from the imaging elements 504 and 510 to generate a three-dimensional simulation of the surrounding environment (e.g., a virtual reality of the surrounding environment for display on the display element of the device). Further, the device can utilize outputs from at least one of the image capture elements 504 and 510 to assist in determining the location and/or orientation of a user and in recognizing nearby persons, objects, or locations. For example, if the user is holding the device, the captured image information can be analyzed (e.g., using mapping information about a particular area) to determine the approximate location and/or orientation of the user. The captured image information may also be analyzed to recognize nearby persons, objects, or locations (e.g., by matching parameters or elements from the mapping information).

The computing device can also include at least one microphone or other audio capture elements capable of capturing audio data, such as words spoken by a user of the device, music being hummed by a person near the device, or audio being generated by a nearby speaker or other such component, although audio elements are not required in at least some devices. In this example there are three microphones, one microphone 508 on the front side, one microphone 512 on the back, and one microphone 506 on or near a top or side of the device. In some devices there may be only one microphone, while in other devices there might be at least one microphone on each side and/or corner of the device, or in other appropriate locations.

The device 500 in this example also includes one or more orientation- or position-determining elements 518 operable to provide information such as a position, direction, motion, or orientation of the device. These elements can include, for example, accelerometers, inertial sensors, electronic gyroscopes, and electronic compasses.

The example device also includes at least one communication mechanism 514, such as may include at least one wired or wireless component operable to communicate with one or more electronic devices. The device also includes a power system 516, such as may include a battery operable to be recharged through conventional plug-in approaches, or through other approaches such as capacitive charging through proximity with a power mat or other such device. Various other elements and/or combinations are possible as well within the scope of various embodiments.

Figure 6:
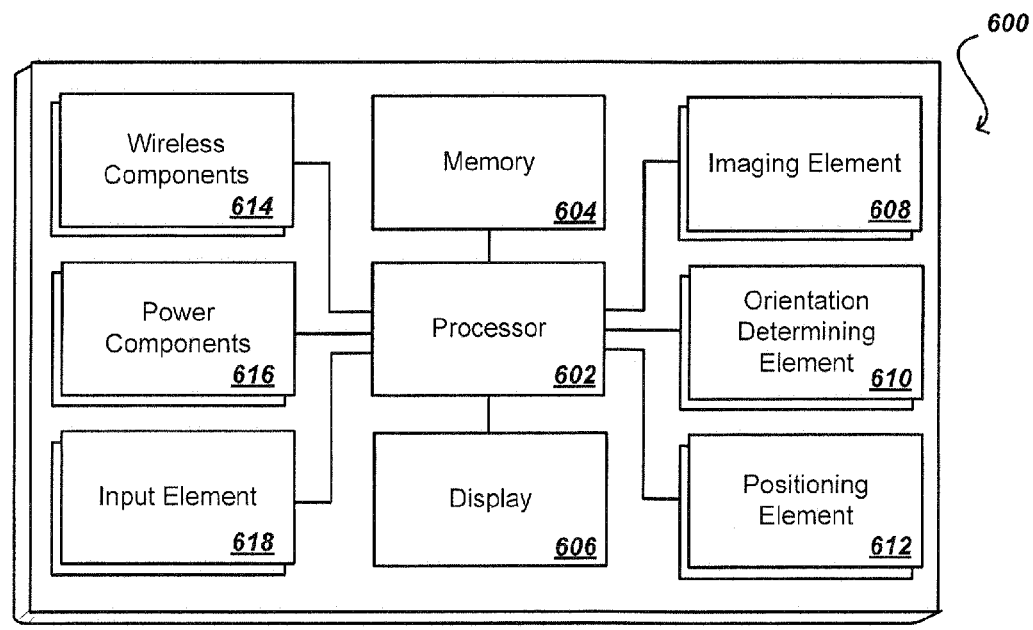
FIG. 6 illustrates an example set of basic components of a portable computing device, such as the device described with respect to FIG. 5.

FIG. 6 illustrates a set of basic components of an electronic computing device 600 such as the device 500 described with respect to FIG. 5. In this example, the device includes at least one processing unit 602 for executing instructions that can be stored in a memory component or element 604. As would be apparent to one of ordinary skill in the art, the device can include many types of memory, data storage, or computer-readable media, such as a first data storage for program instructions for execution by the processing unit(s) 602, the same or separate storage can be used for images or data, a removable memory can be available for sharing information with other devices, and any number of communication approaches can be available for sharing with other devices.

The device typically will include some type of display element 606, such as a touch screen, electronic ink (e-ink), organic light emitting diode (OLED) or liquid crystal display (LCD), although devices such as portable media players might convey information via other means, such as through audio speakers.

As discussed, the device in many embodiments will include at least one imaging element 608, such as one or more cameras that are able to capture images of the surrounding environment and that are able to image a user, people, or objects in the vicinity of the device. The image capture element can include any appropriate technology, such as a CCD image capture element having a sufficient resolution, focal range, and viewable area to capture an image of the user when the user is operating the device. Methods for capturing images using a camera element with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device.

The example computing device 600 also includes at least one orientation determining element 610 able to determine and/or detect orientation and/or movement of the device. Such an element can include, for example, an accelerometer or gyroscope operable to detect movement (e.g., rotational movement, angular displacement, tilt, position, orientation, motion along a non-linear path, etc.) of the device 600. An orientation determining element can also include an electronic or digital compass, which can indicate a direction (e.g., north or south) in which the device is determined to be pointing (e.g., with respect to a primary axis or other such aspect).

As discussed, the device in many embodiments will include at least a positioning element 612 for determining a location of the device (or the user of the device). A positioning element can include or comprise a GPS or similar location-determining elements operable to determine relative coordinates for a position of the device. As mentioned above, positioning elements may include wireless access points, base stations, etc., that may either broadcast location information or enable triangulation of signals to determine the location of the device. Other positioning elements may include QR codes, barcodes, RFID tags, NEC tags, etc., that enable the device to detect and receive location information or identifiers that enable the device to obtain the location information (e.g., by mapping the identifiers to a corresponding location). Various embodiments can include one or more such elements in any appropriate combination.

As mentioned above, some embodiments use the element(s) to track the location of a device. Upon determining an initial position of a device (e.g., using GPS), the device of some embodiments may keep track of the location of the device by using the element(s), or in some instances, by using the orientation determining element(s) as mentioned above, or a combination thereof. As should be understood, the algorithms or mechanisms used for determining a position and/or orientation can depend at least in part upon the selection of elements available to the device.

The example device also includes one or more wireless components 614 operable to communicate with one or more electronic devices within a communication range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections as known in the art.

The device also includes a power system 616, such as may include a battery operable to be recharged through conventional plug-in approaches, or through other approaches such as capacitive charging through proximity with a power mat or other such device. Various other elements and/or combinations are possible as well within the scope of various embodiments.

In some embodiments the device can include at least one additional input component 618 able to receive conventional input from a user. This conventional input can include, for example, a push button, touch pad, touch screen, wheel, joystick, keyboard, mouse, keypad, or any other such component or element whereby a user can input a command to the device. These I/O components could even be connected by a wireless infrared or Bluetooth or other link as well in some embodiments. Some devices also can include a microphone or other audio capture element that accepts voice or other audio commands. For example, a device might not include any buttons at all, but might be controlled only through a combination of visual and audio commands, such that a user can control the device without having to be in contact with the device.

In some embodiments, a device can include the ability to activate and/or deactivate detection and/or command modes, such as when receiving a command from a user or an application, or retrying to determine an audio input or video input, etc. In some embodiments, a device can include an infrared detector or motion sensor, for example, which can be used to activate one or more detection modes. For example, a device might not attempt to detect or communicate with devices when there is not a user in the room. If an infrared detector (i.e., a detector with one-pixel resolution that detects changes in state) detects a user entering the room, for example, the device can activate a detection or control mode such that the device can be ready when needed by the user, but conserve power and resources when a user is not nearby.

A computing device, in accordance with various embodiments, may include a light-detecting element that is able to determine whether the device is exposed to ambient light or is in relative or complete darkness. Such an element can be beneficial in a number of ways. In certain conventional devices, a light-detecting element is used to determine when a user is holding a cell phone up to the user's face (causing the light-detecting element to be substantially shielded from the ambient light), which can trigger an action such as the display element of the phone to temporarily shut off (since the user cannot see the display element while holding the device to the user's ear). The light-detecting element could be used in conjunction with information from other elements to adjust the functionality of the device. For example, if the device is unable to detect a user's view location and a user is not holding the device but the device is exposed to ambient light, the device might determine that it has likely been set down by the user and might turn off the display element and disable certain functionality. If the device is unable to detect a user's view location, a user is not holding the device and the device is further not exposed to ambient light, the device might determine that the device has been placed in a bag or other compartment that is likely inaccessible to the user and thus might turn off or disable additional features that might otherwise have been available. In some embodiments, a user must either be looking at the device, holding the device or have the device out in the light in order to activate certain functionality of the device. In other embodiments, the device may include a display element that can operate in different modes, such as reflective (for bright situations) and emissive (for dark situations). Based on the detected light, the device may change modes.

Using the microphone, the device can disable other features for reasons substantially unrelated to power savings. For example, the device can use voice recognition to determine people near the device, such as children, and can disable or enable features, such as Internet access or parental controls, based thereon. Further, the device can analyze recorded noise to attempt to determine an environment, such as whether the device is in a car or on a plane, and that determination can help to decide which features to enable/disable or which actions are taken based upon other inputs. If voice recognition is used, words can be used as input, either directly spoken to the device or indirectly as picked up through conversation. For example, if the device determines that it is in a car, facing the user and detects a word such as "hungry" or "eat," then the device might turn on the display element and display information for nearby restaurants, etc. A user can have the option of turning off voice recording and conversation monitoring for privacy and other such purposes.

In some of the above examples, the actions taken by the device relate to deactivating certain functionality for purposes of reducing power consumption. It should be understood, however, that actions can correspond to other functions that can adjust similar and other potential issues with use of the device. For example, certain functions, such as requesting Web page content, searching for content on a hard drive and opening various applications, can take a certain amount of time to complete. For devices with limited resources, or that have heavy usage, a number of such operations occurring at the same time can cause the device to slow down or even lock up, which can lead to inefficiencies, degrade the user experience and potentially use more power.

In order to address at least some of these and other such issues, approaches in accordance with various embodiments can also utilize information such as user gaze direction to activate resources that are likely to be used in order to spread out the need for processing capacity, memory space and other such resources.

In some embodiments, the device can have sufficient processing capability, and the imaging element and associated analytical algorithm(s) may be sensitive enough to distinguish between the motion of the device, motion of a user's head, motion of the user's eyes and other such motions, based on the captured images alone. In other embodiments, such as where it may be desirable for the process to utilize a fairly simple imaging element and analysis approach, it can be desirable to include at least one orientation determining element that is able to determine a current orientation of the device. In one example, the at least one orientation determining element is at least one single- or multi-axis accelerometer that is able to detect factors such as three-dimensional position of the device and the magnitude and direction of movement of the device, as well as vibration, shock, etc. Methods for using elements such as accelerometers to determine orientation or movement of a device are also known in the art and will not be discussed herein in detail. Other elements for detecting orientation and/or movement can be used as well within the scope of various embodiments for use as the orientation determining element. When the input from an accelerometer or similar element is used along with the input from the camera, the relative movement can be more accurately interpreted, allowing for a more precise input and/or a less complex image analysis algorithm.

When using an imaging element of the computing device to detect motion of the device and/or user, for example, the computing device can use the background in the images to determine movement. For example, if a user holds the device at a fixed orientation (e.g., distance, angle, etc.) to the user and the user changes orientation to the surrounding environment, analyzing an image of the user alone will not result in detecting a change in an orientation of the device. Rather, in some embodiments, the computing device can still detect movement of the device by recognizing the changes in the background imagery behind the user. So, for example, if an object (e.g., a window, picture, tree, bush, building, car, etc.) moves to the left or right in the image, the device can determine that the device has changed orientation, even though the orientation of the device with respect to the user has not changed. In other embodiments, the device may detect that the user has moved with respect to the device and adjust accordingly. For example, if the user tilts their head to the left or right with respect to the device, the content rendered on the display element may likewise tilt to keep the content in orientation with the user.

What is claimed is:

1. A computing device, comprising:
    a measurement component that includes at least one sensor configured to detect an object;
    a first ground component, the at least one sensor being positioned proximate to the first ground component;
    a second ground component, wherein the first ground component electrically couples the measurement component to ground of the computing device and the second ground component electrically couples the measurement component to ground of the measurement component; and
    ground isolation circuitry including at least an electronic switch, the ground isolation circuitry configured to:
        operate the electronic switch in a first position to electrically couple the measurement component to the second ground component in response to receiving a signal at the ground isolation circuitry that has an amplitude that meets a threshold value, the signal being generated by the measurement component in response to detection of the object by the at least one sensor, and
        operate the electronic switch in a second position when the amplitude of the signal is less than the threshold value, to ground the measurement component to the first ground component.

2. The computing device of claim 1, wherein the sensor is configured to measure a distance between the object and the computing device upon receipt of the signal at the ground isolation circuitry, the signal being used to cause the electronic switch to electrically isolate the measurement component from the first ground component.

3. The computing device of claim 1, wherein the ground isolation circuitry further includes:
    a power component configured to provide power to the measurement component when the electronic switch is in the first position; and
    a trigger component configured to place the electronic switch in one of the first position or the second position.

4. A computing device, comprising:
    a measurement component that includes a sensor, the sensor capable of receiving at least electromagnetic interference caused by a first ground component of the computing device, the first ground component corresponding to ground of the computing device; and
    control circuitry coupled to the measurement component and the first ground component, the control circuitry configured to:

in response to receiving an activation signal, electrically couple the measurement component to a second ground component to isolate the measurement component from the first ground component to prevent at least a portion of the electromagnetic interference from the first ground component from coupling to the sensor, the second ground component corresponding to ground of the measurement component, and in response to detecting a disconnect event, electrically couple the measurement component to the first ground component, the disconnect event indicating at least one measurement being obtained by the measurement component.

5. The computing device of claim 4, wherein the control circuitry further includes a switching component, the switching component configured to:

operate in a first position to ground the measurement component to the second ground component in response to receiving the activation signal; and operate in a second position in response to not receiving the activation signal to ground the measurement component to the first ground component.

6. The computing device of claim 5, wherein the switching component includes:

at least one switch;

one or more biasing resistors; and an operational amplifier, at least one input terminal of the operational amplifier being connected to a triggering component of the control circuitry and at least one other input terminal of the operational amplifier being connected to the one or more biasing resistors, wherein based at least in part on a biasing voltage being received at the at least one input terminal, the operational amplifier generates an output to cause the at least one switch to be placed in one of the first position or the second position.

7. The computing device of claim 6, wherein in response to the biasing voltage meeting at least a threshold voltage, the switching component is configured to:

cause a first switch of the switching component to disconnect the measurement component from computing device power; and cause a second switch of the switching component to disconnect the measurement component from computing device ground.

8. The computing device of claim 6, wherein the at least one switch includes at least one of a metal-oxide-semiconductor field-effect transistor (MOSFET), a bipolar junction transistor (BJT), or a complementary metal-oxide-semiconductor (CMOS) transistor.

9. The computing device of claim 4, wherein the control circuitry further includes:

a power component configured to provide power to the measurement component in response to receiving the activation signal; and a triggering component, configured to generate a signal to cause a switching component to operate in one of a first position or a second position based at least in part on the activation signal meeting a threshold.

10. The computing device of claim 9, wherein the power component includes at least a low-dropout (LDO) regulator, a first capacitor, and a second capacitor, wherein the first capacitor is connected between a power input and a ground input of the LDO, and the second capacitor is connected between an output of the LDO and the second ground component.

11. The computer device of claim 4, wherein the control circuitry is further configured to:

detect the disconnect event; and charge, in response to detecting the disconnect event, a power component of the control circuitry, the power component configured to provide power to the measurement component.

12. The computing device of claim 4, wherein the control circuitry is further configured to:

charge a first capacitor and a second capacitor of a power component of the control circuitry;

set a threshold voltage at a switching component of the control circuitry, wherein the first capacitor provides power to the power component and the second capacitor provides the threshold voltage at the switching component.

13. The computing device of claim 12, wherein the threshold voltage is determined based at least in part on a biasing voltage applied to a first resistor and a second resistor of the switching component.

14. The computing device of claim 4, wherein the control circuitry is further configured to:

obtain an indication that an object is detected within a distance of a display screen of the computing device in response to the measurement component being connected to the second ground component.

15. The computing device of claim 4, wherein the disconnect event includes a termination of the activation signal, wherein the activation signal is terminated when at least one of a measurement is obtained or a calibration process is completed.

16. A method, comprising:

electrically coupling, by control circuitry coupled to a measurement component and a first ground component that corresponds to ground of a computing device, in response to receiving an activation signal, the measurement component to a second ground component to isolate the measurement component from the first ground component to prevent at least a portion of electromagnetic interference from the first ground component from coupling to a sensor included in the measurement component, the second ground component corresponding to ground of the measurement component; and electrically coupling, by the control circuitry and in response to detecting a disconnect event, the measurement component to the first ground component, the disconnect event indicating at least one measurement being obtained by the measurement component.

17. The method of claim 16, further comprising:

detecting the disconnect event; and charging, in response to detecting the disconnect event, a power component of the control circuitry, the power component configured to provide power to the measurement component.

18. The method of claim 16, further comprising:

receiving a first signal at a switching component;

receiving a second signal at the switching component; and electrically coupling the measurement component to the second ground component in response to a value of the first signal at least meeting a value of the second signal.

19. The method of claim 16, further comprising:

causing a switch to operate in a first position to ground the measurement component to the second ground component in response to receiving the activation signal; and causing the switch to operate in a second position in response to not receiving the activation signal to ground the measurement component to the first ground component.

* * * * *